US012597924B2

(12) United States Patent
Ito et al.

(10) Patent No.: US 12,597,924 B2
(45) Date of Patent: Apr. 7, 2026

(54) DETERIORATION INHIBITING CIRCUIT

(71) Applicants:DENSO CORPORATION, Kariya-city (JP); TOYOTA JIDOSHA KABUSHIKI KAISHA, Toyota (JP); MIRISE Technologies Corporation, Nisshin (JP)

(72) Inventors: Takasuke Ito, Nisshin (JP); Shigeki Otsuka, Nisshin (JP); Yoshikazu Furuta, Nisshin (JP); Tomohiro Nezuka, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

(21) Appl. No.: 18/537,108

(22) Filed: Dec. 12, 2023

(65) Prior Publication Data

US 2024/0243743 A1    Jul. 18, 2024

(30) Foreign Application Priority Data

Jan. 11, 2023    (JP) ................................. 2023-002430

(51) Int. Cl.
*H03K 17/687* (2006.01)
*H03K 19/20* (2006.01)

(52) U.S. Cl.
CPC ......... *H03K 17/6871* (2013.01); *H03K 19/20* (2013.01)

(58) Field of Classification Search
CPC ............... H03K 17/6871; H03K 19/20; H03K 19/00384; H03F 1/02; H03F 3/45071
See application file for complete search history.

(56) References Cited

U.S. PATENT DOCUMENTS

| 4,646,754 | A | * | 3/1987 | Seale ................. A61B 5/02233 |
| | | | | 702/56 |
| 6,166,971 | A | | 12/2000 | Tamura et al. |
| 6,400,616 | B1 | | 6/2002 | Tamura et al. |

(Continued)

FOREIGN PATENT DOCUMENTS

| JP | 2009-290434 A | 12/2009 |
| JP | 2010-220049 A | 9/2010 |
| JP | 2012-199664 A | 10/2012 |

*Primary Examiner* — Lincoln D Donovan
*Assistant Examiner* — Amit R Bhatia
(74) *Attorney, Agent, or Firm* — Posz Law Group, PLC

(57) ABSTRACT

A deterioration inhibiting circuit includes a switchover circuit that inhibits characteristic deterioration of first and second transistors included in a differential pair circuit having first and second input terminals. A gate of the first transistor is connected to the first input terminal, and a gate of the second transistor is connected to the second input terminal. The switchover circuit executes switchover between a first state and a second state. In the first state, a first voltage is applied to the gate of the first transistor and a second voltage is applied to the gate of the second transistor. In the second state, the second voltage is applied to the gate of the first transistor and the first voltage is applied to the gate of the second transistor. The first voltage is higher than an intermediate voltage, and the second voltage is lower than the intermediate voltage.

11 Claims, 9 Drawing Sheets

(56) References Cited

U.S. PATENT DOCUMENTS

| 8,049,214 B2 | 11/2011 | Marshall | |
| 2002/0125933 A1 | 9/2002 | Tamura et al. | |
| 2018/0226960 A1* | 8/2018 | Goya | H03K 5/19 |

* cited by examiner

FIG. 7

DETERIORATION INHIBITING CIRCUIT

CROSS REFERENCE TO RELATED APPLICATION

This application is based on Japanese Patent Application No. 2023-002430 filed on Jan. 11, 2023, the disclosure of which is incorporated herein by reference.

TECHNICAL FIELD

The present disclosure relates to a deterioration inhibiting circuit.

BACKGROUND

A deterioration inhibiting circuit may inhibit characteristic deterioration of a pair of metal-oxide-semiconductor field-effect transistors (MOSFETs) included in a differential pair circuit that outputs an output signal according to the difference between a pair of input signals.

SUMMARY

The present disclosure describes a deterioration inhibiting circuit including a switchover circuit.

BRIEF DESCRIPTION OF DRAWINGS

FIG. 7 illustrates a second timing example of the switchover between the normal application state and the opposite-phase application state executed by the switchover circuit according to the first embodiment.

DETAILED DESCRIPTION

Figure 1:
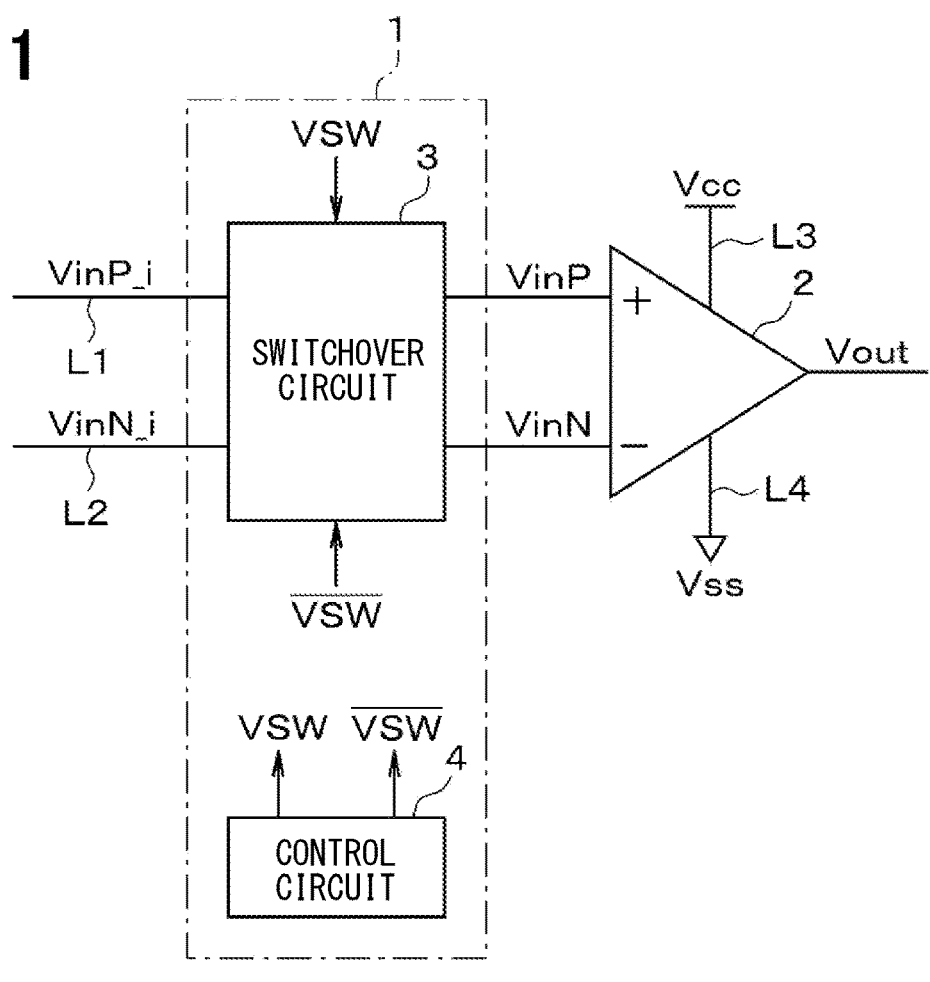
FIG. 1 schematically illustrates the structure of each of a deterioration inhibiting circuit and a differential pair circuit according to a first embodiment.

A differential pair circuit may include a P-channel MOSFET. In the present disclosure, the P-channel MOSFET may also be referred to as a PMOS transistor. The PMOS transistor may have characteristic deterioration due to negative bias temperature instability (NBTI). In other words, a gate threshold voltage may fluctuate in the PMOS transistor. The characteristic deterioration caused by NBTI may occur while a DC potential difference is generated between a gate and a back gate of the MOSFET, and may be particularly noticeable when the MOSFET has been used for a long time at a high temperature. However, the characteristic deterioration caused by NBTI may not occur while a DC potential difference is not occurring between the gate and the back gate of the MOSFET.

For example, when a reception circuit of a communication device adopts the differential pair circuit, the characteristic deterioration of the MOSFET included in the differential pair circuit may occur and affect a reception operation of a communication signal executed by the reception signal. Therefore, a variety of countermeasures for the characteristic deterioration of the MOSFET caused by NBTI may be provided. In a first related example, a differential pair circuit may include an N-channel MOSFET but not the PMOS transistor at an output stage. The PMOS transistor easily has the characteristic deterioration caused by NBTI. The N-channel MOSFET hardly has the characteristic deterioration caused by NBTI. In the present disclosure, the N-channel MOSFET may also be referred to as an NMOS transistor.

In a second related example, a differential pair circuit may include a control circuit that sets the gate and back gate of the PMOS transistor to the identical potentials for inhibiting the occurrence of characteristic deterioration caused by NBTI as much as possible. In a third related example, a device may have a function for adjusting a voltage of a back gate having a fin field-effect transistor (FinFET) structure to correct fluctuation of a gate threshold voltage.

According to the first related example, although the characteristic deterioration caused by NBTI may be hardly generated by adopting the NMOS transistor, the characteristic deterioration caused by positive bias temperature stability (PBTI) may occur even though the influence of PBTI is smaller than the influence of NBTI. Both of NBTI and PBTI cause the gate threshold voltage to fluctuate while the DC potential difference occurs between the gate and back gate of the MOSFET. NBTI and PBTI may be collectively referred to as BTI in a case where there is no need to distinguish the NBTI and PBTI in the present disclosure.

According to the second related example, it is possible to inhibit the characteristic deterioration caused by PBTI by operating the control circuit when the differential pair circuit is not operating by setting the gate and the back gate of the PMOS transistor to the identical potentials. However, a considerable amount of characteristic deterioration caused by PBTI may occur since the control circuit cannot be operated when the differential pair circuit is operating. In the second related example, when the device has been used for a long time at a high temperature in, for example, an in-vehicle system, the characteristic deterioration caused by PBTI may not be neglected. According to the third related example, even though the gate threshold voltage fluctuates, adjustment can be executed to correct the fluctuation. However, the circuitry size may increase as an analog circuit may be required to execute such adjustment.

According to an aspect of the present disclosure, a deterioration inhibiting circuit includes a switchover circuit that inhibits characteristic deterioration of a pair of MOS transistors included in a differential pair circuit. The differential pair circuit has a first input terminal and a second input terminal. The differential pair circuit outputs an output signal according to a difference between a pair of input signals provided to the first input terminal and the second input terminal. The pair of MOS transistors are a first transistor and a second transistor. A gate of the first transistor is connected to the first input terminal. A gate of the second transistor is connected to the second input terminal. The switchover circuit executes switchover between a first state and a second state. The first state is a state in which a first voltage is applied to the gate of the first transistor and a second voltage is applied to the gate of the second transistor, and the second state is a state in which the second voltage is applied to the gate of the first transistor and the first voltage is applied to the gate of the second transistor. The first voltage is higher than an intermediate voltage by a threshold voltage, and the second voltage is lower than the intermediate voltage by the threshold voltage.

In this situation, the characteristic deterioration of the MOSFETs due to BTI, that is, the BTI fluctuation, causes the gate threshold voltage to fluctuate while a DC potential difference occurs between the gate and back gate of each of the MOSFETs. Therefore, it is considered that the deterioration can be improved by generating a reverse bias between the gate and the back gate of each of the MOSFETs. According to the above structure, in addition to the normal application state as a phase in which a positive-phase voltage is applied to the input of the differential pair circuit, the amount of fluctuation in the identical phase of the BTI fluctuation is cancelled by providing an opposite-phase application state as a phase in which a negative-phase voltage is applied.

In the above structure, it is possible to prevent almost any DC potential difference from occurring between the gate and the back gate of each of a pair of the MOSFETs included in the differential pair circuit. As a result, it is possible to suppress characteristic fluctuation of the MOSFETs. In the above structure, since the switchover circuit can be switched to the opposite-phase application state even when the differential pair circuit is operating, it is possible to suppress the characteristic deterioration due to BTI even when the differential pair circuit is operating. Since the above structure does not require an analog circuit, the circuitry size can be reduced accordingly. According to the above structure, an advantageous effect can be acquired such that it is possible to suppress the characteristic deterioration of MOSFETs without increasing the circuitry size.

Hereinafter, multiple embodiments will be described with reference to the drawings. Hereinafter, in the respective embodiments, substantially the same configurations are denoted by identical symbols, and repetitive description will be omitted.

First Embodiment

Hereinafter, a first embodiment will be described with reference to FIG. 1 to FIG. 9.

(Overall Structure)

As shown in FIG. 1, a deterioration inhibiting circuit 1 according to the present embodiment is a circuit that inhibits the characteristic deterioration of a pair of MOSFETs included in a differential pair circuit 2. The differential pair circuit 2 is adapted to a communication device applied to, for example, an in-vehicle system or an industrial machine. The differential pair circuit 2 is included in a reception circuit of the communication device that executes communication with other devices. The deterioration inhibiting circuit 1 and the differential pair circuit 2 are configured as semiconductor integrated circuits (ICs).

The deterioration inhibiting circuit 1 includes a switchover circuit 3 and a control circuit 4. The switchover circuit 3 can execute switchover between a normal application state and an opposite-phase application state. In the present application, the normal application state corresponds to a first state; and the opposite-phase application state corresponds to a second state. The control circuit 4 controls the operation of the switchover circuit 3. The operation of the switchover circuit 3 is controlled based on signals VSW, VSW-bar generated by the control circuit 4. With regard to the signal VSW-bar, "−" is placed above VSW as shown in, for example, FIG. 1. The differential pair circuit 2 outputs an output signal Vout according to the difference between a pair of input signals VinP_i, VinN_i that are respectively provided to a non-inverting input terminal and an inverting input terminal. The non-inverting input terminal functions as a first input terminal. The inverting input terminal functions as a second input terminal. In other words, the differential pair circuit 2 functions as a comparator.

In the present embodiment, a pair of input signals VinP_i, VinN_i are differential communication signals representing transmission data transmitted from another device. The pair of input signals VinP_i and VinN_i are provided through a pair of signal lines L1 and L2, and then provided to the differential pair circuit 2 via the switchover circuit 3 included in the deterioration inhibiting circuit 1. In this case, the voltage at the non-inverting input terminal of the differential pair circuit 2 may be referred to as an input voltage VinP, and the voltage at the inverting input terminal may be referred to as an input voltage VinN. The differential pair circuit 2 operates in response to a power supply voltage Vcc applied via power supply lines L3 and L4.

Figure 2:
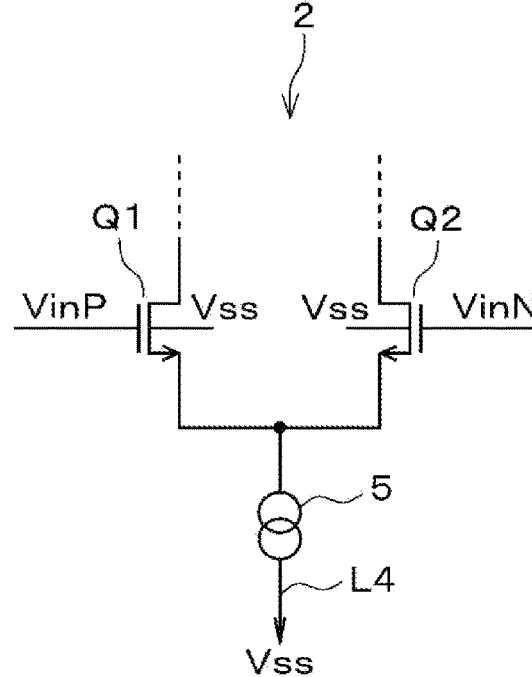
FIG. 2 illustrates a structural example of the differential pair circuit according to the first embodiment.

As shown in, for example, FIG. 2, the differential pair circuit 2 includes a structure as an input stage having a pair of MOSFETs Q1, Q2 and a current source 5 that outputs a constant current. MOSFETs Q1 and Q2 are NMOS transistors, and their sources are connected through the current source 5 to the power supply line L4 to which a reference potential Vss of the circuit is applied. The reference potential Vss is applied to respective back gates of the MOSFETs Q1 and Q2. Although not shown, the respective drains of the MOSFETs Q1 and Q2 are connected to a power supply line L3 to which a power supply voltage Vcc is applied via an active load.

The input voltage VinP is applied to the gate of the MOSFET Q1. The input voltage VinN is applied to the gate of the MOSFET Q2. In the following, the MOSFET Q1 whose gate is connected to the non-inverting input terminal of the differential pair circuit 2 may also be referred to as a first transistor Q1; and the MOSFET Q2 whose gate is connected to the inverting input terminal of the differential pair circuit 2 may also be referred to as a second transistor Q2.

Figure 3:
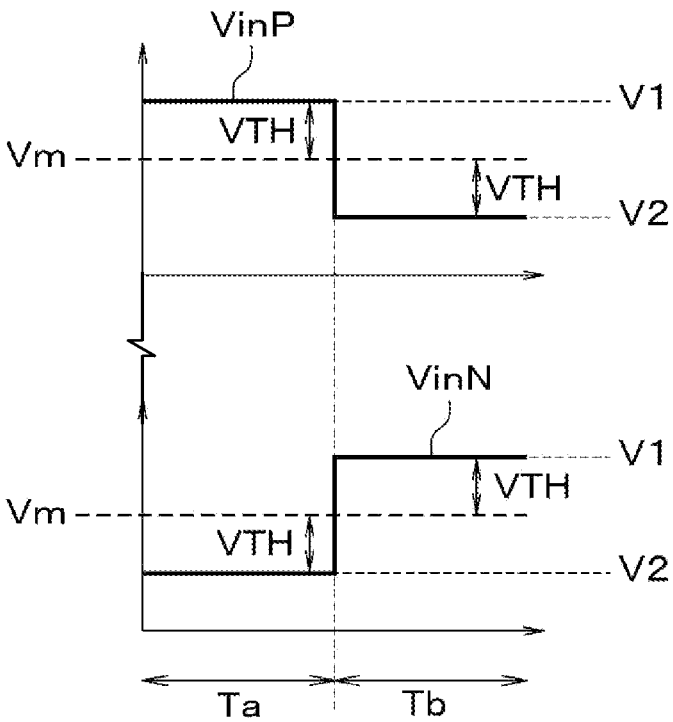
FIG. 3 schematically illustrates each input voltage of the differential pair circuit in a normal application state and an opposite-phase application state according to the first embodiment.

In the normal application state as one of the switching states executed by the switchover circuit 3, a first voltage V1 is applied to the gate of the first transistor Q1 and a second voltage V2 is applied to the gate of the second transistor Q2. In other words, the input voltage VinP is set to the first voltage V1 and the input voltage VinN is set to the second voltage V2 in the normal application state. In the opposite-phase application state as one of the switching states executed by the switchover circuit 3, the second voltage V2 is applied to the gate of the first transistor Q1 and the first voltage V1 is applied to the gate of the second transistor Q2. In other words, the input voltage VinP is set to the second voltage V2 and the input voltage VinN is set to the first voltage V1 in the opposite-phase application state, as seen in FIG. 3.

The first voltage V1 is a voltage higher than an intermediate voltage Vm by a predetermined threshold voltage VTH, as expressed by the following equation (1). However, the intermediate voltage Vm is a voltage being a half of the power supply voltage Vcc, as expressed by the following equation (2).

$$V1 = Vm + VTH \qquad (1)$$

$$Vm = Vcc/2 \qquad (2)$$

The second voltage V2 is a voltage being lower than the intermediate voltage Vm by the threshold voltage VTH, as expressed by the following equation (3).

$$V2 = Vm - VTH \qquad (3)$$

As shown in FIG. 3, in a period Ta during which the switchover circuit 3 is switched to the normal application state, the input voltage VinP becomes the first voltage V1 being higher than the intermediate voltage Vm by the threshold voltage VTH; and the input voltage VinN becomes the second voltage V2 being lower than the intermediate voltage Vm by the threshold voltage VTH. In the period Tb during which the switchover circuit 3 is switched to the opposite-phase application state, the input voltage VinP becomes the second voltage V2; and the input voltage VinN becomes the first voltage V1.

In the above-mentioned structure, when the switchover between the normal application state and the opposite-phase application state, the differential voltage ΔVd between the input voltages VinP and VinN of the differential pair circuit 2 is 0 as expressed by the following equation (4).

$$\Delta Vd = (Vm + VTH - (Vm - VTH)) + (Vm - VTH - (Vm + VTH)) \qquad (4)$$
$$= (2 \times VTH) + (-2 \times VTH)$$
$$= 0$$

According to the above structure, BTI fluctuation is canceled when the switchover between the normal application state and the opposite-phase application state is executed.

(Structure of Switchover Circuit)

Figure 4:
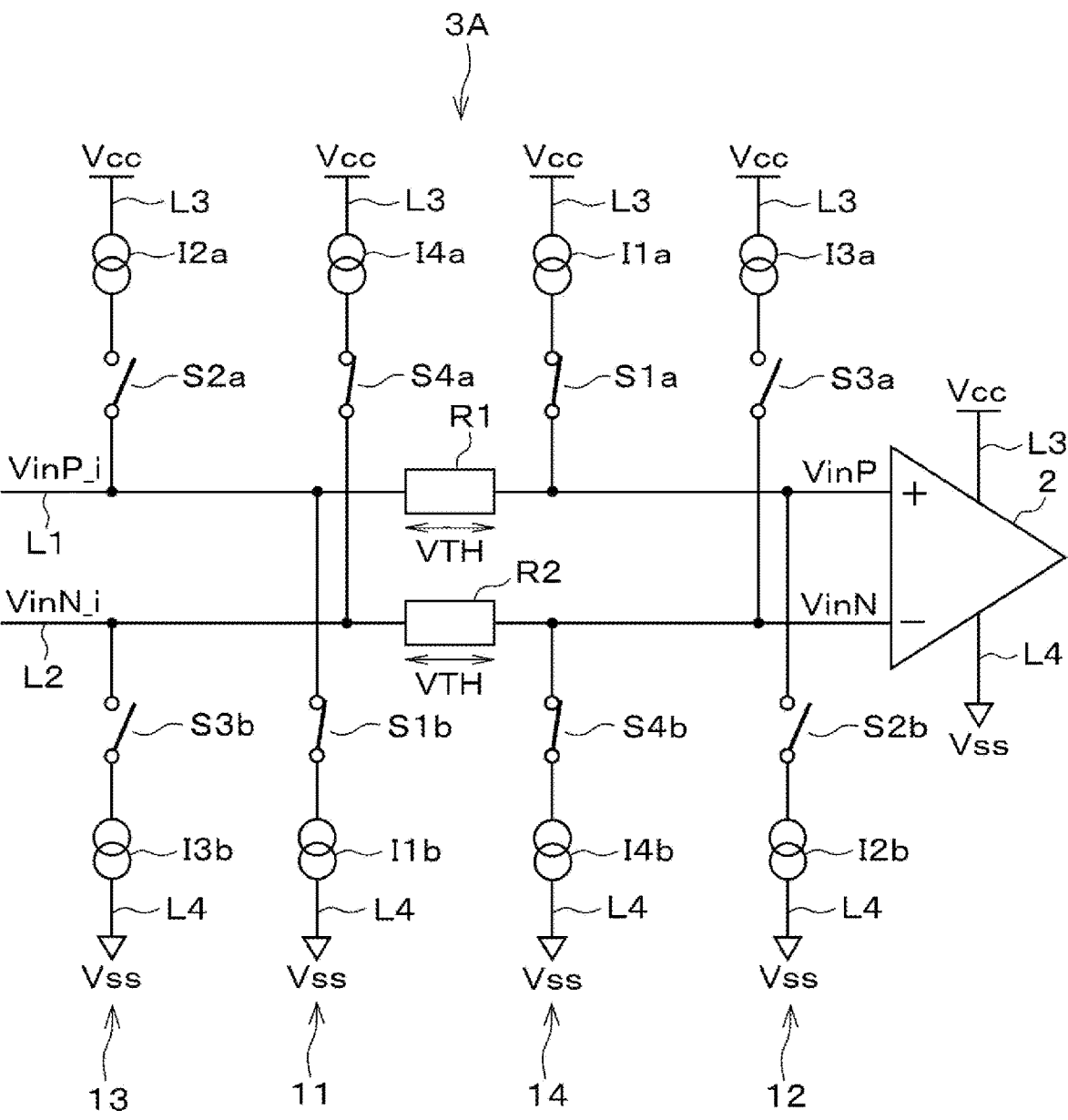
FIG. 4 illustrates a first structural example of a switchover circuit according to the first embodiment.
Figure 5:
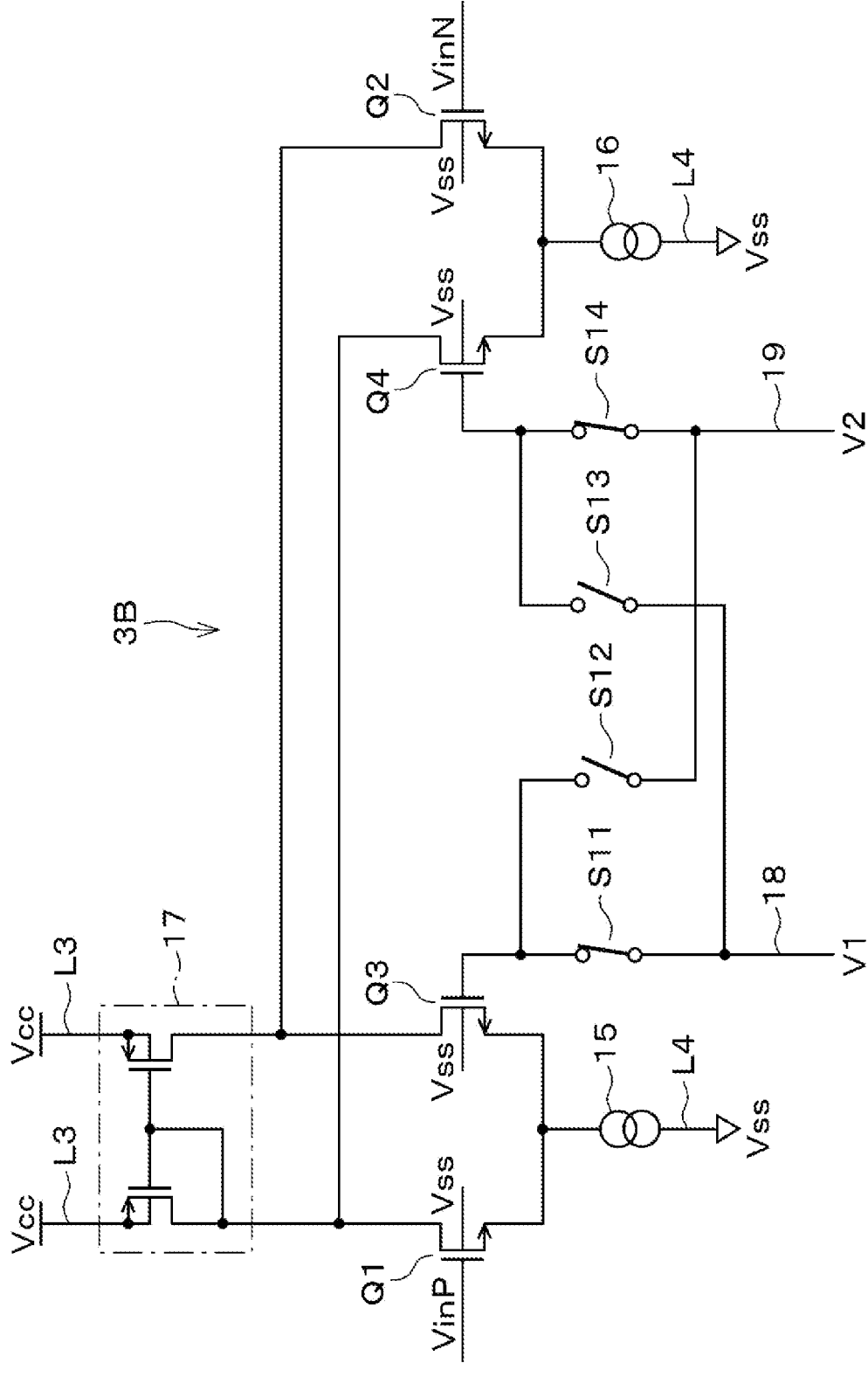
FIG. 5 illustrates a second structural example of the switchover circuit according to the first embodiment.

For example, the switchover circuit 3 may have a first structural example as shown in FIG. 4 or a second structural example as shown in FIG. 5.

First Structural Example

As shown in FIG. 4, a switchover circuit 3A according to the first structural example includes, for example, a first resistor R1, a second resistor R2, current sources I1a, I1b, I2a, I2b, I3a, I3b, I4a, I4b and switches S1a, S1b, S2a, S2b, S3a, S3b, S4a, S4b.

The first resistor R1 has a terminal connected to a non-inverting input terminal of the differential pair circuit 2, and has another terminal connected to a signal line L1. The second resistor R2 has a terminal connected to the inverting input terminal of the differential pair circuit 2, and has another terminal connected to a signal line L2. The eight current sources I1a to I4b are constant current sources that output constant currents.

One of the terminals of the first resistor R1 is connected to a power supply line L3 through the switch S1a and the current source I1a. The other one of the terminals of the first resistor R1 is connected to the power supply line L4 via the switch S1b and the current source I1b. The other one of the terminals of the first resistor R1 is connected to the power supply line L3 via the switch S2a and the current source I2a. One of the terminals of the first resistor R1 is connected to the power supply line L4 through the switch S2b and the current source I2b.

One of the terminals of the second resistor R2 is connected to a power supply line L3 through the switch S3a and the current source I3a. The other one of the terminals of the second resistor R2 is connected to the power supply line L4 via the switch S3b and the current source I3b. The other one of the terminals of the second resistor R2 is connected to the power supply line L3 via the switch S4a and the current source I4a. One of the terminals of the second resistor R2 is connected to the power supply line L4 through the switch S4b and the current source I4b.

In the above structure, in a period during which the switches S1a, S1b are being turned on, currents corresponding to the current values of the current sources I1a, I1b flow from one of the terminals of the first resistor R1 to the other one of the terminals of the first resistor R1. In this situation, the resistance value of the first resistor R1 and the current values of the current sources I1a, I1b are set, such that the voltage of the other one of the terminals of the first resistor in the period during which the switches S1a, S1b are being turned on reaches the threshold voltage VTH, in other words, the first voltage is generated at one of the terminals of the first resistor R1. In the above structure, the switches S1a, S1b and the current sources I1a, I1b function as a first current circuit 11 that is capable of executing an operation for generating the first voltage V1 at the one of the terminals of the first resistor R1 due to the current flowing through the first resistor R1.

In the above structure, in a period during which the switches S2a, S2b are being turned on, currents corresponding to the current values of the current sources I2a, I2b flow from the other one of the terminals of the first resistor R1 to the one of the terminals of the first resistor R1. In this situation, the resistance value of the first resistor R1 and the current values of the current sources I2a, I2b are set, such that the voltage of the other one of the terminals of the first resistor in the period during which the switches S2a, S2b are being turned on reaches the threshold voltage VTH, in other words, the second voltage V2 is generated at the one of the terminals of the first resistor R1. In the above structure, the switches S2a, S2b and the current sources I2a, I2b function as a second current circuit 12 that is capable of executing an operation for generating the second voltage V2 at the one of the terminals of the first resistor R1 due to the current flowing through the first resistor R1.

In the above structure, in a period during which the switches S3a, S3b are being turned on, currents corresponding to the current values of the current sources I3a, I3b flow from the one of the terminals of the second resistor R2 to the other one of the terminals of the second resistor R2. In this situation, the resistance value of the second resistor R2 and the current values of the current sources I3a, I3b are set, such that the voltage of the other one of the terminals of the second resistor R2 in the period during which the switches S3a, S3b are being turned on reaches the intermediate voltage Vm and the voltage drop at the second resistor R2 reaches the threshold voltage VTH. In other words, the resistance value of the second resistor R2 and the current values of the current sources I3a, I3b are set, such that the first voltage V1 is generated at the one of the terminals of the second resistor R2. In the above structure, the switches S3a, S3b and the current sources I3a, I3b function as a third current circuit 13 that is capable of executing an operation for generating the first voltage V1 at the one of the terminals of the second resistor R2 due to the current flowing through the second resistor R2.

In the above structure, in a period during which the switches S4a, S4b are being turned on, currents corresponding to the current values of the current sources I4a, I4b flow from the other one of the terminals of the second resistor R2 to the one of the terminals of the second resistor R2. In this situation, the resistance value of the second resistor R2 and the current values of the current sources I4a, I4b are set, such that the voltage of the other one of the terminals of the second resistor R2 in the period during which the switches S4a, S4b are being turned on reaches the intermediate voltage Vm and the voltage drop at the second resistor R2 reaches the threshold voltage VTH. In other words, the resistance value of the second resistor R2 and the current values of the current sources I4a, I4b are set, such that the second voltage V2 is generated at the one of the terminals of the second resistor R2. In the above structure, the switches S4a, S4b and the current sources I4a, I4b function as a fourth current circuit 14 that is capable of executing an operation for generating the second voltage V2 at the one of the terminals of the second resistor R2 due to the current flowing through the second resistor R2.

The switches S1a, S1b, S4a, and S4b are turned on and off based on a binary signal VSW provided from the control circuit 4. The switches S2a, S2b, S3a, and S3b are turned on and off based on the signal VSW-bar provided from the control circuit 4. The signals VSW and VSW-bar are both binary signals. In the present disclosure, with regard to the binary signal such as the signals VSW and VSW-bar, a relatively high level may be referred to as a high level; and a relatively low level may be referred to as a low level.

Specifically, the switches S1a, S1b, S4a, and S4b are being turned on in the period during which the signal VSW is at the high level, and are being turned off in the period during which the signal VSW is at the low level. The switches S2a, S2b, S3a, and S3b are being turned on in the period during which the signal VSW-bar is at the high level, and are being turned off in the period during which the signal VSW-bar is at the low level. In this situation, the signal VSW-bar is an inverted signal of the signal VSW. Therefore, in the above structure, the switches S1a, S1b, S4a, and S4b and the switches S2a, S2b, S3a, and S3b are turned on and off in a complementary manner.

When the switchover circuit 3A is set to the normal application state, the control circuit 4 sets the signal VSW to the high level. As a result, in the normal application state, the switches S1a, S1b, S4a, and S4b are being turned on; and the switches S2a, S2b, S3a, and S3b are being turned off. That is, in the normal application state, the control circuit 4 executes the operation of the first current circuit 11 and the fourth current circuit 14, and stops the operation of the second current circuit 12 and the third current circuit 13. As a result, in the normal application state, the input voltage VinP reaches the first voltage V1; and the input voltage VinN reaches the second voltage V2.

The control circuit 4 sets the signal VSW-bar to the high level when the switchover circuit 3A is set to the opposite-phase application state. As a result, in the opposite-phase application state, the switches S2a, S2b, S3a, and S3b are being turned on; and the switches S1a, S1b, S4a, and S4b are being turned off. That is, in the opposite-phase application state, the control circuit 4 executes the operation of the second current circuit 12 and the third current circuit 13, and stops the operation of the first current circuit 11 and the fourth current circuit 14. As a result, in the opposite-phase application state, the input voltage VinP reaches the second voltage V2; and the input voltage VinN reaches the first voltage V1.

Second Structural Example

As illustrated in FIG. 5, a switchover circuit 3B according to the second structural example includes, for example, MOSFETs Q3, Q4 and switches S11, S12, S13, S14. In this situation, the differential pair circuit 2 includes two current sources 15, 16. The source of the first transistor Q1 is connected to the power supply line L4 through the current source I5, and the source of the second transistor Q2 is connected to the power supply line L4 through the current source I6. The drains of the first transistor Q1 and the second transistor Q2 are connected to the power supply line L3 via an active load 17 having a current mirror circuit made up of two PMOS transistors.

The MOSFETs Q3 and Q4 are NMOS transistors. The source of MOSFET Q3 is connected to power supply line L4 through the current source I5, and the source of MOSFET Q4 is connected to the power supply line L4 through the current source I6. A reference potential Vss is applied to the back gates of the MOSFETs Q3 and Q4. The drains of MOSFETs Q3 and Q4 are connected to the power supply line L3 through the active load 17.

In the above structure, the MOSFETs Q3 functions as a third transistor forming a current mirror circuit together with the first transistor Q1. In the above structure, the MOSFETs Q4 functions as a fourth transistor forming a current mirror circuit together with the second transistor Q2. In the following, the MOSFET Q3 may also be referred to as the third transistor Q3; and the MOSFET Q4 may also be referred to as the fourth transistor Q4.

The gate of the third transistor Q3 is connected to a voltage line 18 through the switch S11, and is connected a voltage line 19 through the switch S12. The voltage line 18 is supplied with the first voltage V1, and the voltage line 19 is supplied with the second voltage V2. The gate of the fourth transistor Q4 is connected to the voltage line 18 through the switch S13, and is connected to the voltage line 19 through the switch S14.

The switches S11 and S14 are turned on and off based on the signal VSW provided from the control circuit 4. The switches S12 and S13 are turned on and off based on the signal VSW provided from the control circuit 4. The signals VSW, VSW-bar are identical to the signals described in the first structural example. The switches S11, S14 are being turned on in a period during which the signal VSW is at the high level, and are being turned off in a period during which the signal VSW is at the low level. The switches S12, S13 are being turned on in a period during which the signal VSW-bar is at the high level, and are being turned off in a period during which the signal VSW-bar is at the low level. In the above configuration, the switches S11 and S14 and the switches S12 and S13 are turned on and off in a complementary manner.

The control circuit 4 sets the signal VSW to the high level, when the switchover circuit 3B is switched to the normal application state. As a result, in the normal application state, the switches S11 and S14 are being turned on; and the switches S12 and S13 are being turned off. That is, in the normal application state, the control circuit 4 controls the operation of the switchover circuit 3B so that the first voltage V1 is applied to the gate of the third transistor Q3 and the second voltage V2 is applied to the gate of the fourth transistor Q4.

The control circuit 4 sets the signal VSW-bar to the high level when the switchover circuit 3B is switched to the opposite-phase application state. As a result, in the opposite-phase application state, the switches S12 and S13 are being turned on; and the switches S11 and S14 are being turned off. That is, in the opposite-phase application state, the control circuit 4 controls the operation of the switching circuit 3B such that the second voltage V2 is applied to the gate of the third transistor Q3 and the first voltage V1 is applied to gate of the fourth transistor Q4.

Features of Each Structural Example

According to the first structural example, since it is possible to set the threshold voltage VTH to an arbitrary value by the resistance values of the first resistor R1 and the second resistor R2 and the current values of the current sources I1$a$ to I4$b$ regardless of the current value of the current source 5 for the operation current of the differential pair circuit 2, it is possible to apply the first voltage V1 and the second voltage V2 to the input terminals of the differential pair circuit 2 with high precision. However, the input range of the differential pair circuit 2 might be reduced in the first structural example.

In the second structural example, although the precision of the first voltage V1 and the second voltage V2 applied to the input terminals of the differential pair circuit 2 is relatively low as compared with the first structural example, the deterioration inhibiting circuit 1 does not affect the input range of the differential pair circuit 2. Therefore, it is possible to sufficiently secure the input range. According to the second structural example, it is possible to keep the circuity size at a smaller scale as compared with the first structural example, because the number of required current sources is smaller.

(Switching Timing of Each State of Switchover Circuit)

Figure 6:
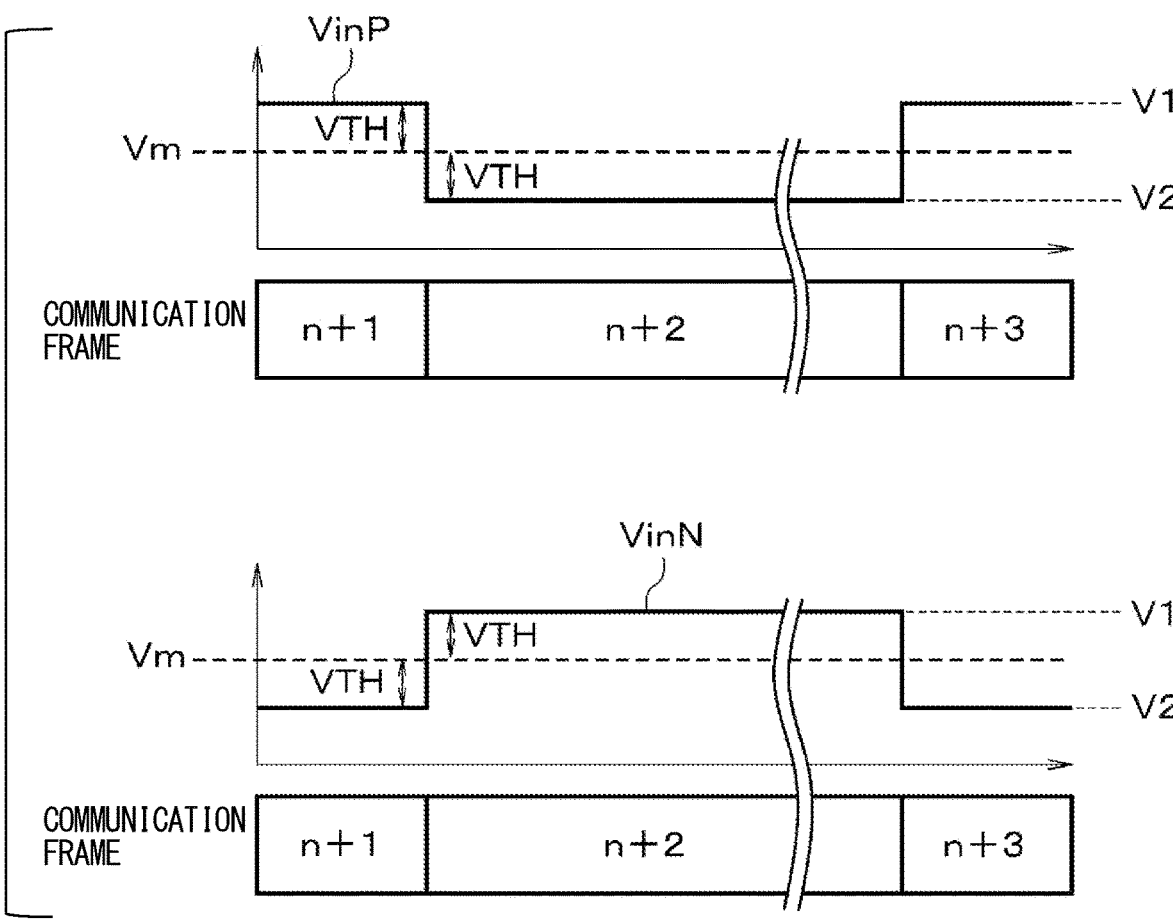
FIG. 6 illustrates a first timing example of the switchover between the normal application state and the opposite-phase application state executed by the switchover circuit according to the first embodiment.
Figure 7:
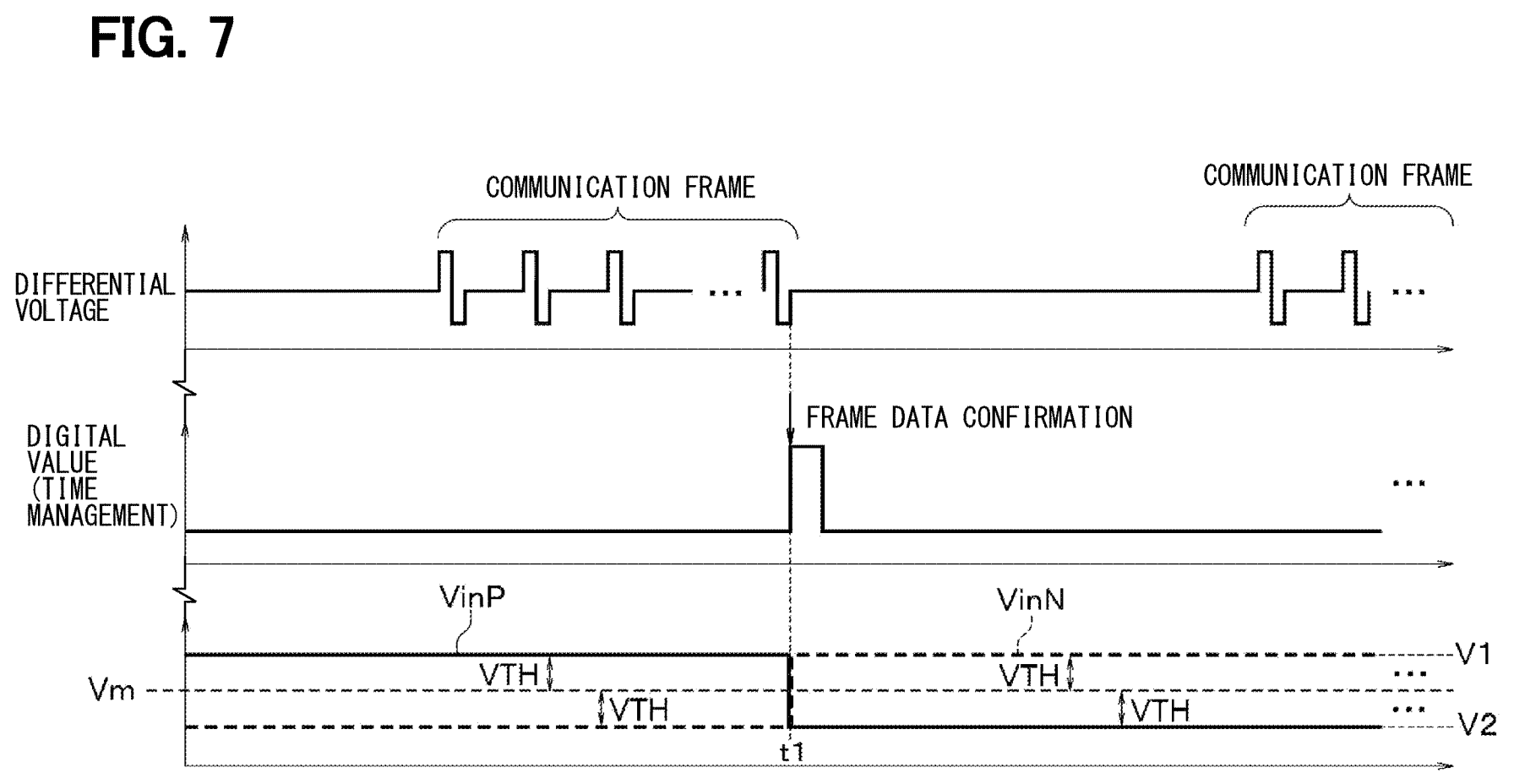
Figure 8:
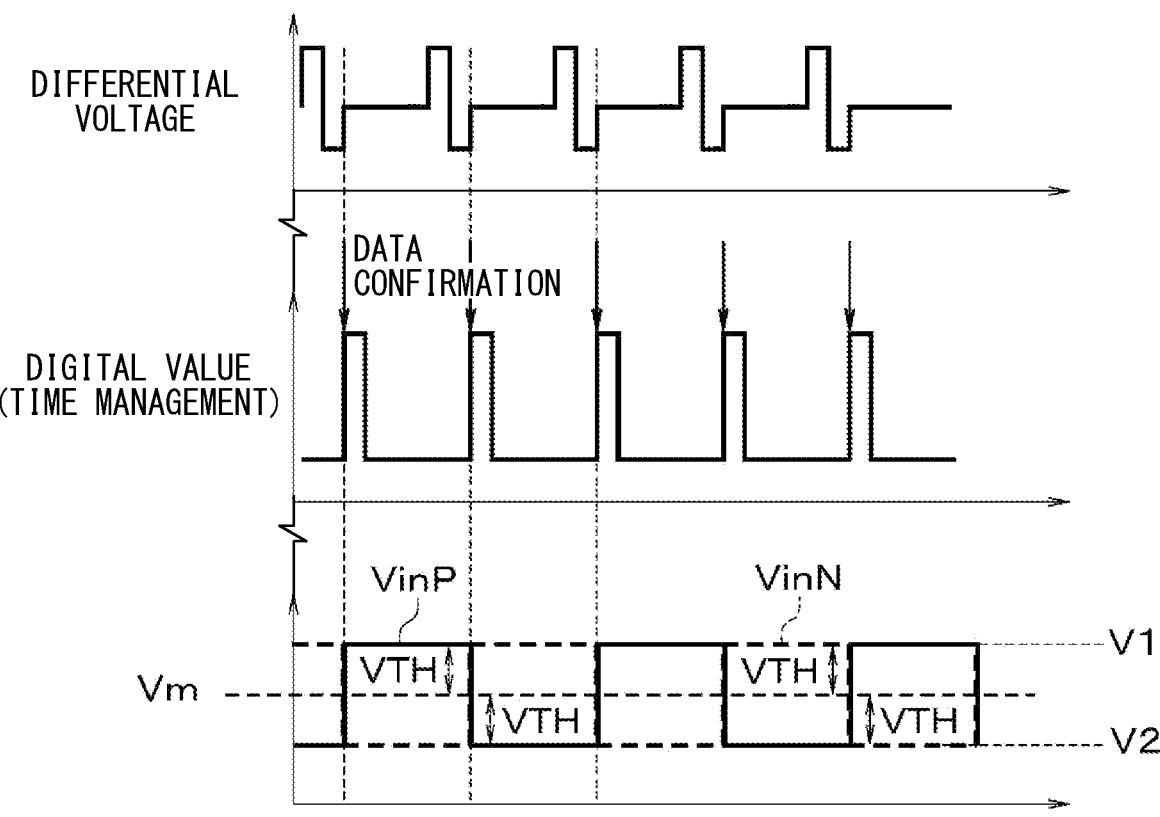
FIG. 8 illustrates a third timing example of the switchover between the normal application state and the opposite-phase application state executed by the switchover circuit according to the first embodiment.

For the timing of switchover between the normal application state and the opposite-phase application state executed by the switchover circuit 3, for example, the first timing example as illustrated in FIG. 6, the second timing example as illustrated in FIG. 7, and the third timing example as illustrated in FIG. 8 can be adopted.

First Timing Example

As illustrated in FIG. 6, the switchover circuit 3 is capable of executing switchover between the normal application state and the opposite-phase application state each time the switchover circuit 3 receives one frame of transmission data transmitted from another device. In particular, the switchover circuit 3 is capable of changing the switchover state each time the switchover circuit 3 receives one frame of transmission data, such that the switchover circuit 3 is changed to the normal application state in a period of receiving a communication frame n+1, and then is changed to the opposite-phase application state in a period of receiving a subsequent communication frame n+2, and is further changed to the normal application state in a period of receiving a subsequent communication frame n+3.

Second Timing Example

The second timing example changes the switchover state each time one frame of transmission is received, as similar to the first timing example. However, the timing of switchover is more specific in the second timing example. As shown in FIG. 7, the switchover circuit 3 is capable of executing switchover between the normal application state and the opposite-phase application at timing t1 when the frame data is confirmed. In other words, as shown in FIG. 7, the switchover is executed between the normal application state and the opposite-phase application at timing t1 when the completion of reception of the frame data is confirmed. In FIG. 7 or the like, the differential voltage corresponds to the difference between the input signals VinP_i and VinN_i; and the digital value corresponds to a digital value acquired from the output signal Vout of the differential pair circuit 2.

The second timing example assumes that communication frames are transmitted periodically. As shown in FIG. 7, the switchover circuit 3 is capable of changing the switchover state at the timing where the frame data is confirmed, such that the switchover circuit 3 waits for the frame data to be confirmed after receiving the periodically transmitted communication frame and then executes the switchover from the normal application state to the opposite-phase application state.

Third Timing Example

Third timing example assumes that the communication signals are transmitted continuously. As shown in FIG. 8, the switchover circuit 3 is capable of executing switchover between the normal application state and the opposite-phase application state each time the communication signal is received. In particular, the switchover circuit 3 is capable of changing the switchover state when the data is confirmed after receiving the communication signal. FIG. 8 illustrates that the timing at which data is confirmed is indicated by a black arrow.

Feature of Each Timing Example

According to the first timing example and the second timing example, the switchover state is changed each time one frame of transmission data is received; therefore, the number of times of switchover can be kept small as compared to the third timing example. As a result, it is possible to suppress the complexity of control related to switchover. On the other hand, the third timing example can be applied even when the communication signals are transmitted continuously. Therefore, it is possible that the third timing example enhances the versatility of application as compared to the first and second timing examples.

According to the present embodiment described above, the following advantageous effects are obtained. The switchover circuit 3 included in the deterioration inhibiting circuit 1 is capable of executing switchover between the normal application state and the opposite-phase application state. In the normal application state, the first voltage V1 is applied to the non-inverting input terminal of the differential pair circuit 2, in other words, the gate of the first transistor Q1; and the second voltage V2 is applied to the inverting input terminal of the differential pair circuit 2, in other words, the gate of the second transistor Q2. In the opposite-phase application state, the second voltage V2 is applied to the gate of the first transistor Q1 and the first voltage V1 is applied to the gate of the second transistor Q2. The first voltage is higher than the intermediate voltage Vm by the threshold voltage Vm, and the second voltage is lower than the intermediate voltage by the threshold voltage VTH.

In this embodiment, the characteristic deterioration of the MOSFETs Q1, Q2 due to BTI, that is, the BTI fluctuation, causes the gate threshold voltage to change during a period in which a DC potential difference occurs between the gate and back gate of each of the MOSFETs Q1, Q2. Therefore, it is considered that the deterioration can be improved by generating a reverse bias between the gate and the back gate of each of the MOSFETs Q1, Q2. According to the above structure, in addition to the normal application state as a phase in which a positive-phase voltage is applied to the input of the differential pair circuit 2, the amount of fluctuation in the identical phase of the BTI fluctuation is cancelled by providing an opposite-phase application state as a phase in which a negative-phase voltage is applied.

In the above structure, it is possible to prevent almost any DC potential difference from occurring between the gate and the back gate of each of a pair of the MOSFETs Q1, Q2 included in the differential pair circuit 2. As a result, it is possible to suppress characteristic fluctuation of the MOS-FETs Q1, Q2. In the above structure, since the switchover circuit 3 is capable of switching the state to the opposite-phase application state even when the differential pair circuit 2 is operating, it is possible to suppress the characteristic deterioration due to BTI even when the differential pair circuit 2 is operating. Since the above structure does not require an analog circuit, the circuitry size can be reduced accordingly. According to the present embodiment, an advantageous effect can be acquired such that it is possible to suppress the characteristic deterioration of MOSFETs Q1, Q2 without increasing the circuitry size.

Figure 9:
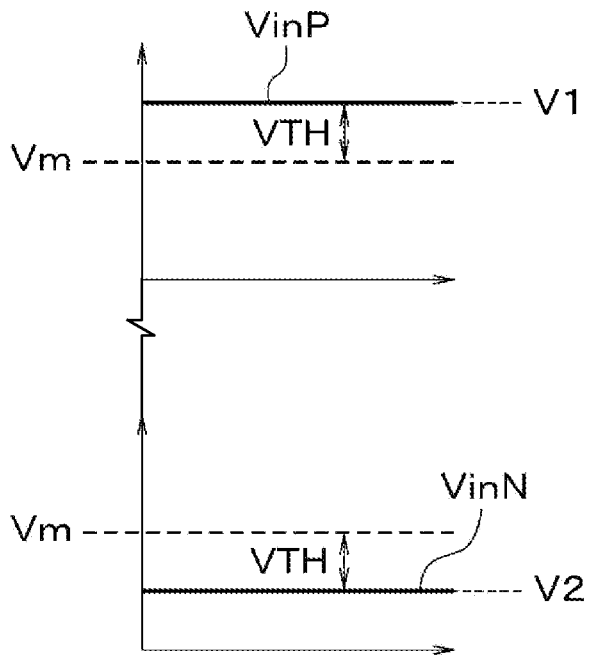
FIG. 9 schematically illustrates each input voltage of a differential pair circuit according to a comparative example.

The advantageous effect acquired by this embodiment will be further clarified by comparing with a comparative example. As shown in FIG. 9, in the comparative example, the input voltage VinP is normally the first voltage V1 higher than the intermediate voltage Vm by the threshold voltage VTH; and the input voltage VinN is normally the second voltage V2 lower than the intermediate voltage Vm by the threshold voltage VTH.

In the comparative example, the differential voltage ΔVd between the input voltages VinP and VinN of the differential pair circuit 2 is "2×VTH" as expressed by the following equation (5).

$$\Delta Vd = (VM + VTH) - (Vm - VTH) = 2 \times VTH \qquad (5)$$

Thus, it can be seen that BTI fluctuation occurs in the comparative example. In contrast, according to the structure described in the present embodiment, as shown in FIG. 3 and the equation (4), the differential voltage between the input voltages VinP and VinN of the differential pair circuit 2 is "0". According to the configuration of this embodiment, BTI fluctuation is canceled by switchover between the normal application state and the reverse phase application state.

Second Embodiment

Figure 10:
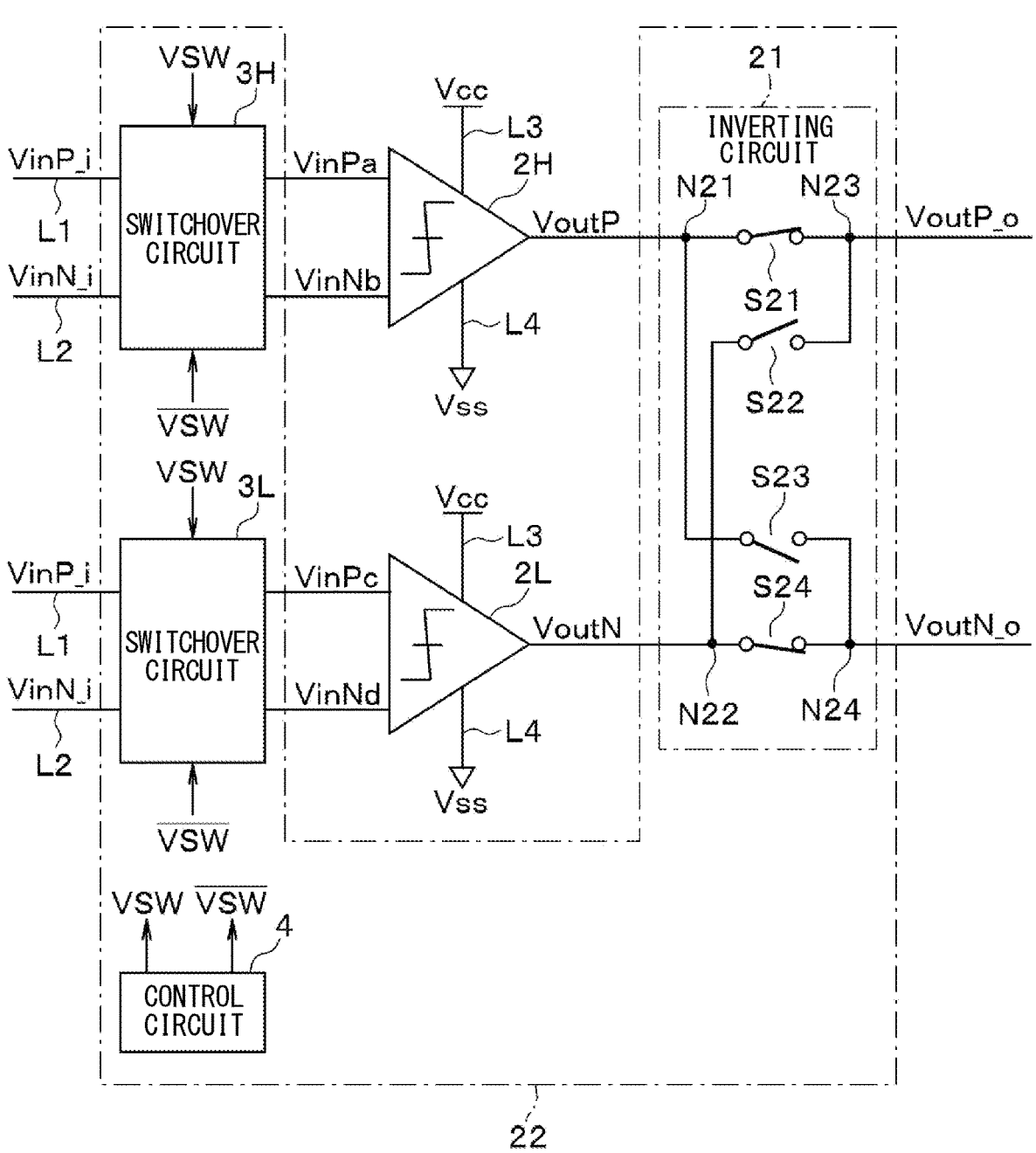
FIG. 10 schematically illustrates the structure of each of a deterioration inhibiting circuit and a differential pair circuit according to a second embodiment.
Figure 11:
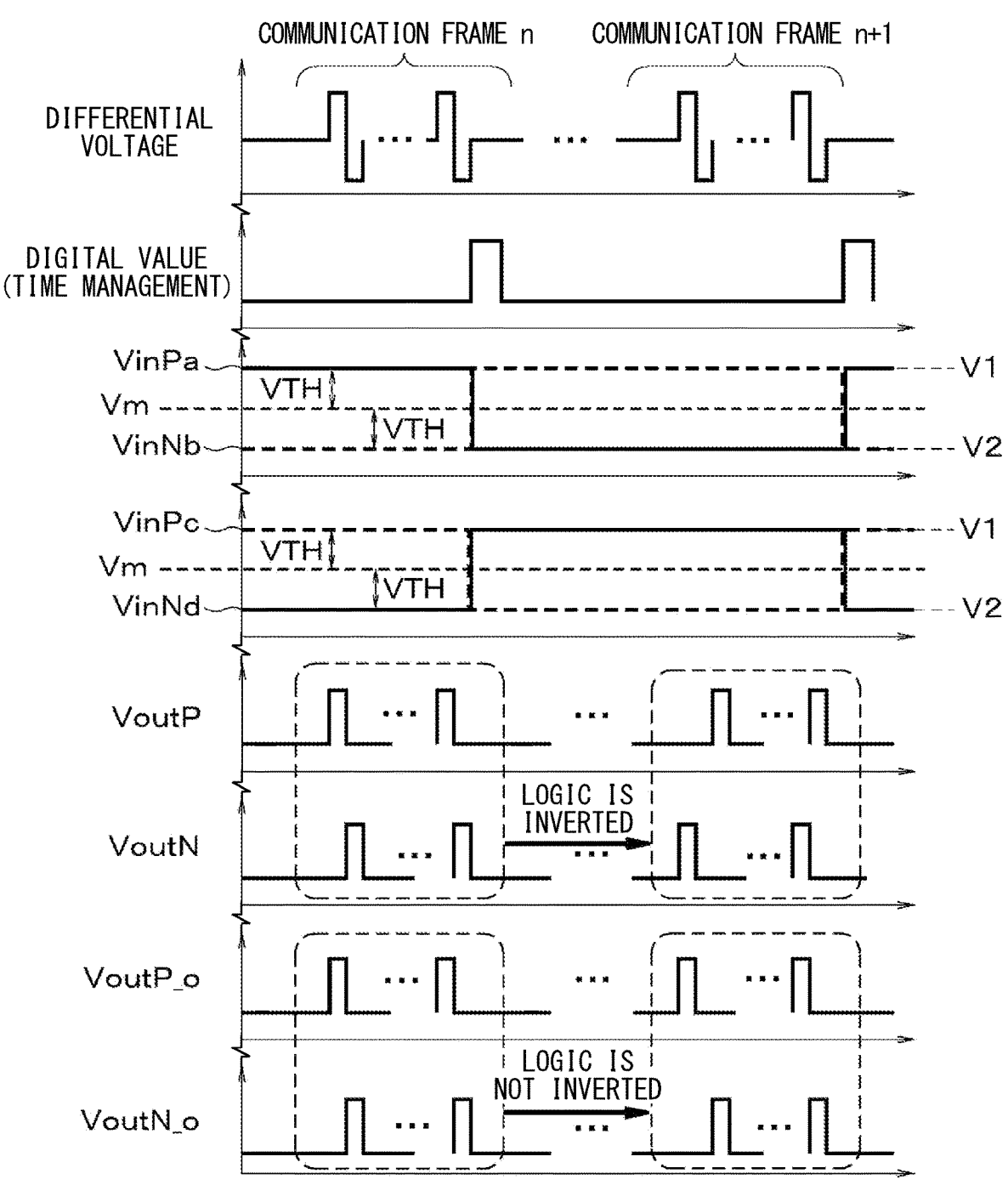
FIG. 11 illustrates a timing example of the switchover between the normal application state and the opposite-phase application state executed by the switchover circuit according to the second embodiment, and illustrates the operation of an inverting circuit.

A second embodiment will hereinafter be described with reference to FIG. 10 and FIG. 11. As shown in FIG. 10, in the present embodiment, the reception circuit of the communication device is provided with a duel system in which two switchover circuits 3 and two differential pair circuits 2 are provided. Each of the two switchover circuits 3 described in the present embodiment has a structure identical to the switchover circuit 3 described in the first embodiment, and each of the two differential pair circuits 2 described in the present embodiment has a structure identical to the differential pair circuit 2 described in the first embodiment. The communication device according to the present embodiment executes communication using Manchester code.

In this situation, one of the two switchover circuits 3 corresponding to an upper threshold value may be referred to as a switchover circuit 3H, and another one of the two switchover circuits 3 corresponding to a lower threshold value may be referred to as a switchover circuit 3L. In this situation, one of the two differential pair circuits 2 corresponding to an upper threshold value may be referred to as a differential pair circuit 2H, and another one of the two differential pair circuits 2 corresponding to a lower threshold value may be referred to as a differential pair circuit 2L. In the present embodiment, a deterioration inhibiting circuit 22 includes the switchover circuits 3H, 3L and an inverting circuit 21.

In this situation, the voltage at the non-inverting input terminal of the differential pair circuit 2H may be referred to as an input voltage VinPa, and the voltage at the inverting input terminal may be referred to as an input voltage VinNb. In this case, the voltage at the non-inverting input terminal of the differential pair circuit 2L may be referred to as an input voltage VinPc, and the voltage at the inverting input terminal may be referred to as an input voltage VinNd. The differential pair circuit 2H outputs an output signal VoutP according to the difference between a pair of the input signals VinP_i and VinN_i. In addition, the differential pair circuit 2L outputs an output signal VoutN according to the difference between the pair of input signals VinP_i and VinN_i. The output signals VoutP and VoutN are provided to the inverting circuit 21.

The inverting circuit 21 inverts the logic represented by the output signals VoutP, VoutN in the period during which the switchover circuits 3H, 3L are switched to the opposite-phase application state, and includes switches S21, S22, S23, S24. The inverting circuit 21 has an input node N21, an input node N22, an output node N23, and an output node N24. The input node N21 receives an input of the output signal VoutP. The input node N22 receives an input of the output signal VoutN. The output node N23 outputs an output signal VoutP_o corresponding to the output signal VoutP. The output node N24 outputs the output signal VoutN_o corresponding to the output signal VoutN.

The switch S21 is connected between the input node N21 and the output node N23. The switch S22 is connected between the input node N22 and the output node N23. The switch S23 is connected between the input node N21 and the output node N24. The switch S24 is connected between the input node N22 and the output node N24. The switches S21 and S24 are turned on and off based on the signal VSW provided from the control circuit 4. The switches S22 and S23 are turned on and off based on the signal VSW provided from the control circuit 4.

The switches S21, S24 are being turned on in a period during which the signal VSW is at the high level, and are being turned off in a period during which the signal VSW is at the low level. The switches S22, S23 are being turned on in a period during which the signal VSW-bar is at the high level, and are being turned off in a period during which the signal VSW-bar is at the low level. In the above structure, the switches S21 and S24 and the switches S22 and S23 are turned on and off in a complementary manner.

As a result, the inverting circuit 21 outputs the output signal VoutP_o representing the logic identical to the output signal VoutP and the output signal VoutN_o representing the logic identical to the output signal VoutN in a period during which the switchover circuits 3 is switched to the normal application state. In addition, the inverting circuit 21 outputs the output signal VoutP_o representing the logic being opposite to the output signal VoutP and the output signal VoutN_o representing the logic being opposite to the output signal VoutN in a period during which the switchover circuits 3 is switched to the opposite-phase application state. In this case, the output signals VoutP_o and VoutN_o become the output of the reception circuit.

In the present embodiment, the second timing example shown in FIG. 7 is adopted as the specific timing at which the switchover circuits 3H and 3L execute switchover between the normal application state and the opposite-phase application state. Therefore, as shown in FIG. 11, the switchover circuits 3H and 3L change their switching states each time they receive one frame of transmission data. In particular, the switchover circuits 3H, 3L are capable of changing the switchover state each time one frame of transmission data is received, such that the switchover circuits 3H, 3L are switched to the normal application state in a period of receiving a communication frame n, and then are switched to the opposite-phase application state in a period of receiving a subsequent communication frame n+1. In this case, the switchover between the normal application state and the opposite-phase application state is executed at the timing when the frame data is confirmed.

In the present disclosure, it is assumed that the communication frame n and communication frame n+1 represent the same data. In the above structure, the logic of the Manchester code of the output signals VoutP, VoutN of the differential pair circuits 2H and 2L is inverted between the communication frame n and the communication frame n+1. In the above structure, the logic of the Manchester code of the output signals VoutP, VoutN of the inverting circuit 21 is not inverted between the communication frame n and the communication frame n+1, but represents the identical logic.

As described above, the deterioration inhibiting circuit 22 according to the present embodiment is applied to a situation in which the reception circuit of the communication device is provided with a duel system. The deterioration inhibiting circuit 22 includes an inverting circuit 21 that inverts the logic represented by the output signals VoutP, VoutN in a period during which the switchover circuits 3H, 3L are switched to the opposite-phase application state. According to a related structure without the inverting circuit 21, in the opposite-phase application state, since a reception threshold voltage is in an opposite phase with respect to the normal application state, the logic of the Manchester code of the output voltages VoutP, VoutN as the output of the reception circuit is inverted.

According to such a structure, the communication device may not execute correct communication. In contrast, according to the structure related to the present embodiment, even in the opposite-phase application state, the logic of the Manchester code of the output voltages VoutP, VoutN as the output of the reception circuit is not inverted due to the operation of the inverting circuit, and represents the same logic as in the normal application state. As a result, the communication device is capable of executing normal communication.

Other Embodiments

The present disclosure is not limited to the embodiments that have been described above and illustrated in the drawings, but can arbitrarily be modified, combined, or expanded without departing from the gist of the present disclosure. The numerical values and the like illustrated in each of the above embodiments are merely examples, and the present disclosure is not limited thereto.

The deterioration inhibiting circuits 1, 22 are not limited to the differential pair circuit 2 adopted in the reception circuit of the communication device that may be adapted to, for example, automotive application and industrial equipment, but are also intended for a variety of differential pair circuits that are capable of inhibiting the characteristic deterioration of a pair of the MOSFETs included in these differential pair circuits. Each of the above embodiments describes that the differential pair circuit includes the MOSFETs Q1, Q2 as a pair of the NMOS transistors. However, the differential pair circuit may also include a pair of PMOS transistors.

Although the present disclosure has been described in accordance with the examples, it is understood that the disclosure is not limited to such examples or structures. The present disclosure encompasses various modifications and variations within the scope of equivalents. Furthermore, various combination and formation, and other combination and formation including one, more than one or less than one element may be made in the present disclosure.

What is claimed is:

1. A deterioration inhibiting circuit comprising:
a switchover circuit configured to inhibit characteristic deterioration of a pair of MOS transistors included in a differential pair circuit, wherein:
the differential pair circuit has a first input terminal and a second input terminal, and is configured to output an output signal according to a difference between a pair of input signals provided to the first input terminal and the second input terminal;
the pair of MOS transistors are
a first transistor whose gate is connected to the first input terminal, and
a second transistor whose gate is connected to the second input terminal;
the switchover circuit is further configured to execute switchover between a first state and a second state;
in the first state, the switchover circuit applies a first voltage to the gate of the first transistor and applies a second voltage to the gate of the second transistor, and in the second state, the switchover circuit applies the second voltage to the gate of the first transistor and applies the first voltage to the gate of the second transistor; and
the first voltage is higher than an intermediate voltage that is a half of a power supply, by a predetermined threshold voltage, and the second voltage is lower than the intermediate voltage by the predetermined threshold voltage.

2. The deterioration inhibiting circuit according to claim 1, wherein:
the differential pair circuit is included in a reception circuit of a communication device configured to execute communication with an other device;
the pair of input signals correspond to a differential communication signal representing transmission data transmitted from the other device; and the switchover circuit is further configured to execute the switchover between the first state and the second state each time one frame of the transmission data is received.

3. The deterioration inhibiting circuit according to claim 2, wherein the switchover circuit is configured to execute the switchover between the first state and the second state at a timing where completion of reception of the one frame of the transmission data is confirmed.

4. The deterioration inhibiting circuit according to claim 2, further comprising:

an inverting circuit configured to invert a logic represented by the output signal in a period during which the switchover circuit is being switched to the second state.

5. The deterioration inhibiting circuit according to claim 1, wherein:

the differential pair circuit is included in a reception circuit of a communication device configured to execute communication with an other device;

the pair of input signals correspond to a differential communication signal representing transmission data transmitted from the other device; and the switchover circuit is configured to execute the switchover between the first state and the second state each time the differential communication signal is received.

6. The deterioration inhibiting circuit according to claim 1, wherein:

the switchover circuit includes a first resistor having one of terminals that is connected to the first input terminal, a second resistor having one of terminals that is connected to the second input terminal, a first current circuit configured to generate the first voltage at the one of the terminals of the first resistor by allowing a current to flow through the first resistor, a second current circuit configured to generate the second voltage at the one of the terminals of the first resistor by allowing a current to flow through the first resistor, a third current circuit configured to generate the first voltage at the one of the terminals of the second resistor by allowing a current to flow through the second resistor, and a fourth current circuit configured to generate the second voltage at the one of the terminals of the second resistor by allowing a current to flow through the second resistor; and the switchover circuit is further configured to execute an operation of the first current circuit and the fourth current circuit and stop an operation of the second current circuit and the third current circuit in the first state, and execute the operation of the second current circuit and the third current circuit and stop the operation of the first current circuit and the fourth current circuit in the second state.

7. The deterioration inhibiting circuit according to claim 1, wherein:

the switchover circuit includes a third transistor being a MOS transistor, the third transistor and the first transistor, which is included in the differential pair circuit, together forming a first current mirror circuit, and a fourth transistor being a MOS transistor, the fourth transistor and the second transistor, which is included in the differential pair circuit, together forming a second current mirror circuit;

a source of the first transistor is connected to a source of the third transistor in the first current mirror circuit;

a source of the second transistor is connected to a source of the fourth transistor in the second current mirror circuit; and the switchover circuit is further configured to apply the first voltage to a gate of the third transistor and apply the second voltage to a gate of the fourth transistor in the first state, and apply the second voltage to the gate of the third transistor and apply the first voltage to the gate of the fourth transistor in the second state.

8. The deterioration inhibiting circuit according to claim 7, wherein the first transistor, the second transistor, the third transistor and the fourth transistor are NMOS transistors, a drain of the first transistor, a drain of the second transistor, a drain of the third transistor, and a drain of the fourth transistor are each connected to a power supply through an active load, the active load includes two PMOS transistors, and a gate of each of the two PMOS transistors is connected to the drain of the first transistor.

9. The deterioration inhibiting circuit according to claim 1, wherein the differential pair circuit is configured to be operated by receiving a voltage of the power supply.

10. The deterioration inhibiting circuit according to claim 1, wherein the first transistor and the second transistor are NMOS transistors, a source of the first transistor and a source of the second transistor are connected to each other, and to a power supply line to which a reference potential of the differential pair circuit is applied, and the reference potential is applied to a back gate of the first transistor and a back gate of the second transistor.

11. The deterioration inhibiting circuit according to claim 10, wherein a drain of the first transistor and a drain of the second transistor are connected to another power supply line to which a power supply voltage is applied via an active load.

* * * * *